United States Patent
Passaro, Jr. et al.

[11] Patent Number: 5,841,340
[45] Date of Patent: Nov. 24, 1998

[54] SOLDERLESS RF POWER FILM RESISTORS AND TERMINATIONS

[75] Inventors: Thomas J. Passaro, Jr., Commack; Thomas J. Dowling, Port Jefferson; Paul S. Davidsson, Mount Sinai, all of N.Y.

[73] Assignee: RF Power Components, Inc., Bohemia, N.Y.

[21] Appl. No.: 646,053

[22] Filed: May 7, 1996

[51] Int. Cl.$^6$ ................................................. H01C 1/08
[52] U.S. Cl. .......................... 338/51; 338/309; 338/53; 338/220; 338/221; 338/254; 338/256; 333/81 R; 361/714; 361/719
[58] Field of Search .................................... 338/306–309, 338/311, 220, 221, 51, 60, 61, 226, 228, 252, 254, 256, 216, 232; 361/714, 715, 719, 738, 728; 333/81 A, 81 R

[56] References Cited

U.S. PATENT DOCUMENTS

| | | | |
|---|---|---|---|
| 1,728,045 | 9/1929 | Dublier | 338/220 |
| 2,702,884 | 2/1955 | Riblet | 333/81 R |
| 2,890,424 | 6/1959 | Arditi et al. | 333/81 A |
| 3,354,412 | 11/1967 | Steidlitz | 333/81 R |
| 3,541,489 | 11/1970 | Person | 338/51 |
| 3,564,459 | 2/1971 | Hahn | 333/81 R |
| 3,621,479 | 11/1971 | Peterson et al. | 333/81 A |
| 3,955,169 | 5/1976 | Kerfoot et al. | 338/51 |
| 4,260,965 | 4/1981 | Nakamura et al. | 333/81 A |
| 4,613,844 | 9/1986 | Kent et al. | |
| 4,704,659 | 11/1987 | Heng et al. | 361/394 |
| 4,719,443 | 1/1988 | Salay | |
| 4,727,351 | 2/1988 | Harris et al. | |
| 4,764,847 | 8/1988 | Eisenblatter | 361/388 |
| 4,777,456 | 10/1988 | Andrikian et al. | 333/81 A |
| 4,853,828 | 8/1989 | Penn | 361/714 |
| 4,956,748 | 9/1990 | Yamamoto et al. | 361/728 |
| 4,969,066 | 11/1990 | Eibl et al. | 361/728 |
| 5,155,661 | 10/1992 | Nagesh et al. | 361/715 |
| 5,202,752 | 4/1993 | Honjo | 338/81 A |
| 5,291,063 | 3/1994 | Adishian | |
| 5,291,178 | 3/1994 | Strief et al. | 338/226 |
| 5,355,281 | 10/1994 | Adelmann et al. | 361/707 |
| 5,365,403 | 11/1994 | Vinciarelli et al. | 361/707 |
| 5,399,906 | 3/1995 | Nakamura et al. | 338/315 |
| 5,481,241 | 1/1996 | Caddock, Jr. | 338/51 |

*Primary Examiner*—Michael L. Gellner
*Assistant Examiner*—Karl Easthom
*Attorney, Agent, or Firm*—Scully, Scott Murphy and Presser

[57] ABSTRACT

Solderless RF power film resistor and termination assemblies which include a flat film resistor or termination pressed by a nonmetallic clamping plate into thermal contact with a base plate functioning as a heat sink. A substrate such as a BeO ceramic substrate provides an RF power film resistor or termination, and has a flat mounting surface positioned against a flat mounting surface of the base plate. A clamping plate clamps the ceramic substrate securely against the base plate, thereby eliminating a soldered interface connection between the flat mounting surfaces of the ceramic substrate and the base plate. The clamping plate includes at least one lug, and the base plate includes at least one lug hole. The lug is larger than, and is plastically deformed into and through the hole to clamp the flat surface of the ceramic substrate securely against the flat surface of the base plate. The hole in the base plate preferably includes an undercut shoulder through and around which the lug is plastically deformed. Moreover, the lug is hollow, and a torqued mounting screw extends through the hollow lug and the hole in the base plate, and is torqued into a threaded hole in a mounting heat sink. This arrangement further clamps the flat surface of the ceramic substrate securely against the flat surface of the base plate, and also clamps the electrical component securely against the mounting heat sink.

10 Claims, 2 Drawing Sheets

SOLDERLESS RF POWER FILM RESISTORS AND TERMINATIONS

BACKGROUND OF THE INVENTION

1. Field of the Invention

The present invention relates generally to solderless RF power film resistors and terminations, and more particularly pertains to high power solderless RF film resistor and termination assemblies which include a flat film resistor or termination pressed by a nonmetallic clamp plate into thermal contact with a base plate. The base plate has one or more screw holes therein, through which threaded screws are used to mount the assembly to a heatsink.

2. Discussion of the Prior Art

In the prior art, RF power film resistors and terminations have been constructed with a BeO ceramic substrate soldered at an interface to a Cu base plate or element. However, the soldered interface represented a weak link in this construction for the following reasons. During usage, an RF power film resistor or termination frequently cycles in temperature. The BeO ceramic substrate has a different coefficient of thermal expansion than the Cu base element to which it is soldered, and after a number of temperature cycles, the different coefficients of thermal expansion of the BeO ceramic substrate and the Cu base element cause a deterioration and fatigue or weakening of the soldered interface, which eventually results in a separation thereat and failure of the component. Alternatively, in some instances the BeO ceramic substrate would crack. This problem is particularly prevalent with high power RF power film resistors and terminations, such as are frequently used in combiners, amplifiers and generators, which experience more severe temperature cycles during normal usage. In an attempt to alleviate this problem, different materials have been tried and substituted for the BeO ceramic substrate and the Cu base element, but this approach has met with limited success.

The present invention discloses and teaches an alternative approach to the aforementioned problem, and eliminates the solder interface between the BeO ceramic substrate and the Cu base element by clamping the BeO ceramic substrate and the Cu base element together. This technical approach has resulted in an increase of fifty times in the functional lives of such RF power film resistors and terminations, which represents a major and substantial improvement in the construction of such components.

A computer data base search was performed on the development of solderless RF power film resistors and terminations. As a consequence thereof, four patents were ordered for further review and study. Salay U.S. Pat. No. 4,719,443 and Harris et al. U.S. Pat. No. 4,727,351 each disclose prior art soldered products pertinent to the background of the present invention. The intent of the construction of the soldered product disclosed by the Harris et al. patent is to reduce the parasitic capacitance thereof. Adishian U.S. Pat. No. 5,291,063 also discloses a soldered product, and is of interest for a screw 26 which secures a power resistor assembly 10 to the flange 24 of a power transistor. Kent et al. U.S. Pat. No. 4,613,844 is only of general interest to the present invention, and discloses a special thick film process which uses multiple layers of resistors and conductors in parallel to improve resistor stability and current density.

SUMMARY OF THE INVENTION

Accordingly, it is a primary object of the present invention to provide solderless RF power film resistors and terminations.

A further object of the subject invention is the provision of high power, solderless RF film resistor and termination assemblies which include a flat film resistor or termination pressed by a nonmetallic clamp plate into thermal contact with a base plate. The base plate has one or more screw holes therein, through which threaded screws are used to mount the assembly to a heatsink.

In accordance with the teachings herein, the present invention provides a solderless RF power film electrical component. The component comprises a base plate functioning as a heat sink and having a flat mounting surface, which base plate is to be secured to a further mounting heat sink. A substrate provides an RF power resistive film component, and also has a flat mounting surface positioned against the flat mounting surface of the base plate. A clamping means includes a clamping plate for clamping the flat surface of the substrate securely against the flat surface of the base plate, thereby eliminating a soldered interface connection between the flat mounting surfaces of the substrate and the base plate.

In greater detail, the substrate can comprise a RF power film resistor having two output terminals. Alternatively, the substrate can comprise an RF power film termination having a single output terminal.

In a preferred embodiment, the clamping plate includes at least one lug, and the base plate includes at least one lug hole, and the lug is larger than and is plastically deformed into and through the hole to clamp the flat surface of the substrate securely against the flat surface of the base plate. The hole in the base plate preferably includes an undercut shoulder through and around which the lug is plastically deformed. Moreover, the lug is hollow, and a torqued mounting screw extends through the hollow lug and the hole in the base plate, and is torqued into a threaded hole in the mounting heat sink. This arrangement further clamps the flat surface of the substrate securely against the flat surface of the base plate, and also clamps the electrical component securely against the mounting heat sink.

In a preferred embodiment, the clamping plate includes two lugs positioned on opposite sides of the substrate, and the base plate includes two holes positioned on opposite sides of the substrate. Each lug is larger than and is plastically deformed into and through each hole to clamp the flat surface of the substrate securely against the flat surface of the base plate.

A metal foil element can be optionally positioned between the substrate and the base plate which deforms and fills any microscopic voids between the substrate and the base plate to increase the heat conductivity therebetween. An epoxy preform element is also optionally positioned between the clamping plate and the substrate to adhere the clamping plate to the substrate. The clamping plate is preferably constructed of a high temperature plastic to increase the frequency response of the electrical component by minimizing the capacitance between the clamping plate and the substrate. The heat sink on which the RF power film electrical component is mounted is positioned below a circuit board which includes an aperture therein in which the RF power film electrical component is mounted.

The substrate can comprise a BeO ceramic substrate, or in alternative embodiments can comprise a diamond substrate or an aluminum nitride substrate.

BRIEF DESCRIPTION OF THE DRAWINGS

The foregoing objects and advantages of the present invention for solderless RF power film resistors and terminations may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
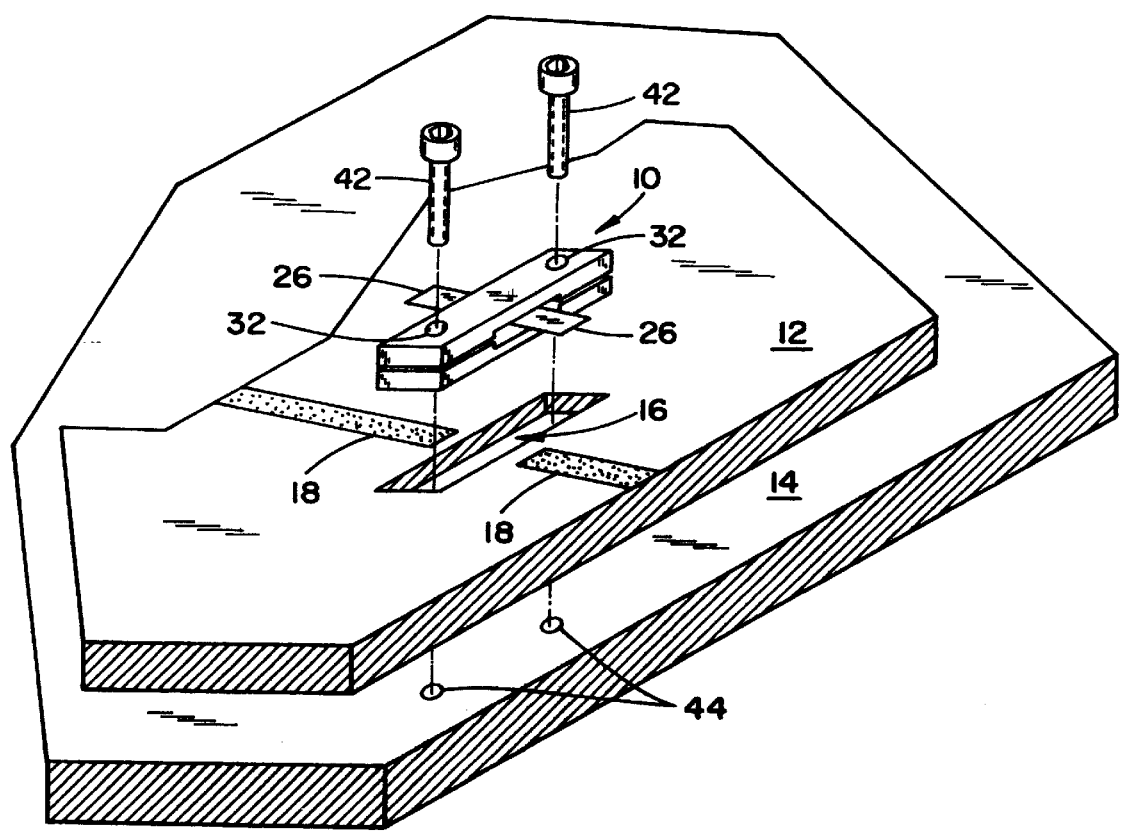
FIG. 1 illustrates a perspective view of a high power solderless RF power film resistor assembly, positioned above and ready to be connected to a circuit board and mounted on a mounting heat sink provided below the circuit board.

Referring to the drawings in detail, FIG. 1 illustrates a perspective view of a high power solderless RF power film resistor assembly 10, positioned above and ready to be connected to a circuit board 12 and mounted on a mounting heat sink 14 provided below the circuit board 12. The circuit board 12 includes a rectangular aperture or slot 16 therein, in which the resistor assembly 10 is mounted. In that position, two output terminal tabs or conductors of the resistor assembly contact two conductive leads 18 provided on the circuit board 12.

Figure 2:
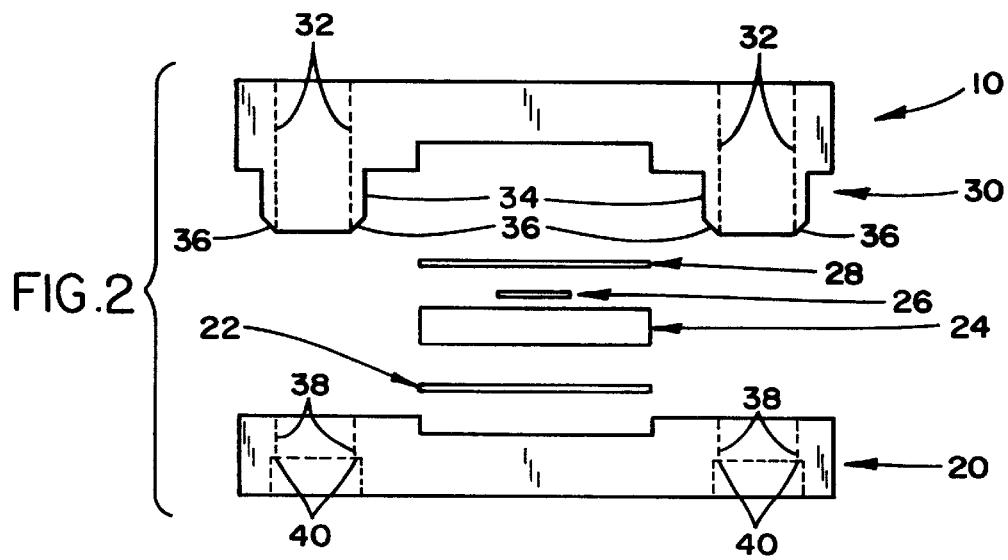
FIG. 2 is an exploded view of one embodiment of an RF power film resistor or termination assembly constructed pursuant to the teachings of the present invention.

FIG. 2 illustrates an exploded view of one embodiment of an RF power film resistor or termination assembly 10 constructed pursuant to the teachings of the present invention. RF power film resistors and terminations are generally constructed in a similar manner, with RF power film resistors having two output terminals and RF power film terminations having only a single output terminal, as is generally known and recognized in the prior art.

The construction of the component 10 includes a Cu bottom plate or base element 20, frequently Ni plated, which functions as a heat spreader or sink. The bottom plate 20 is normally secured directly to the mounting heat sink 14. The construction also includes an optional thin metal (such as AL) foil element 22 placed on top of the base element 20 and beneath a substrate 24. The thin metal foil 22 functions to deform under pressure and fills in voids between the bottom plate 20 and the substrate 24 to maximize thermal conductivity between those two elements.

Figure 3:
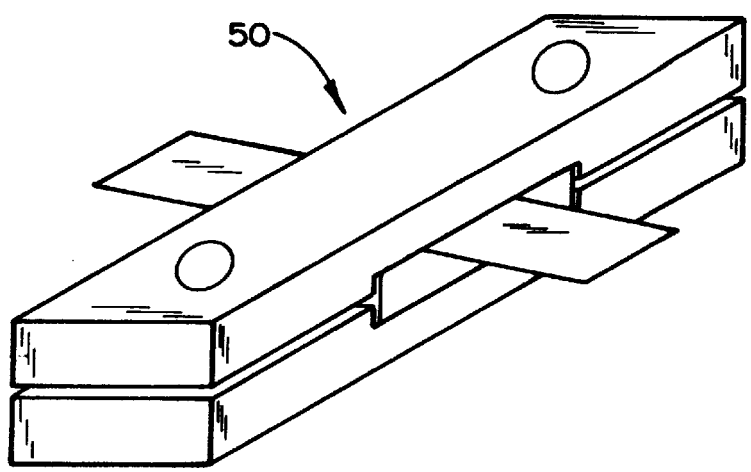
FIG. 3 is an enlarged view of a high power solderless RF power film resistor constructed pursuant to the present invention.
Figure 5:
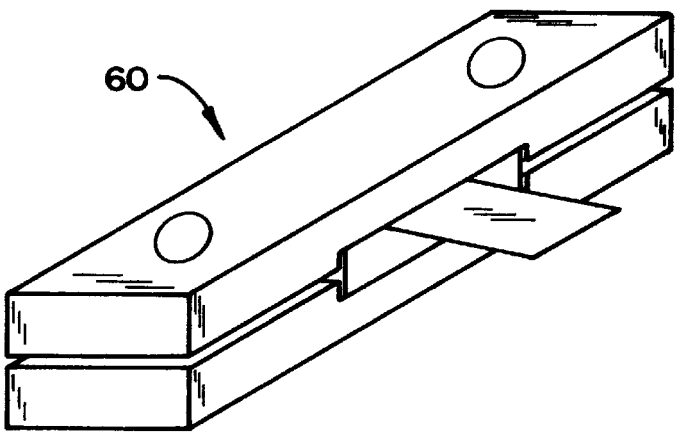
FIG. 5 is an enlarged view of a high power RF power film termination constructed pursuant to the present invention.

The substrate 24 can form an RF power film resistor and have two output terminal tabs 26, as illustrated in FIGS. 1 and 3, or be an RF power film termination with only one output terminal tab, as illustrated in FIG. 5, and is constructed in a manner as is well known in the art. The substrate 24 can comprise a BeO ceramic substrate, or in alternative embodiments can comprise a diamond substrate or an aluminum nitride substrate.

An optional high temperature epoxy perform sheet 28 is used to adhere the substrate 24 to a top clamp plate 30 which can be constructed of a hard high temperature plastic. The top clamp plate 30 is preferably formed from a nonmetallic material to increase the frequency response of the resultant product. A metallic top plate would result in an inherent capacitance being formed between the top plate 30 and the top of the BeO ceramic substrate 24 resistive film, which would decrease the frequency response of the resultant product. FIGS. 1 and 2 also illustrate two mounting holes 32 formed through the top clamp plate 22.

During assembly of the component 10, the top clamp plate 30 is compressed against the bottom plate 20. The top clamp plate 30 includes two depending cylindrical lugs 34, tapered around the bottom thereof at 36, with the diameter of the cylindrical lugs 34 being slightly larger than the diameter of corresponding mounting holes 38 formed through the bottom plate 12. The bottom plate 20 further includes an indent shoulder 40 formed beneath the holes 38. The construction is such that during the aforementioned compressed assembly, the cylindrical lugs 34 deform plastically through the holes 38 and also deform and expand outwardly around the indent shoulders 40 to clamp the assembly together.

After the aforementioned compressed assembly, the assembled embodiment 10 is ready for mounting, typically on a circuit board provided with a heat sink as illustrated in FIG. 1. A thermal grease, typically ceramic loaded silicon, is applied on the base 20 of the component 10, between the lower surface of the base 20 of the component 10 and the heat sink to which it is mounted. Two mounting screws 42 are inserted through the two holes 32, and are threadly engaged into corresponding threaded holes 44 in the heat sink 14. The two mounting screws 42 are torqued to a recommended torque (typically 6 to 10 inch pounds), to assemble the part 10 to the heat sink 14. Some embodiments can employ a socket head, screw flat and lock washer. Thus, in an assembled state, both 1) the compressed and deformed construction of the part 10, and 2) the torqued screw mounting of the part 10 to the heat sink, function to clamp the BeO ceramic substrate 24 to and against the bottom plate 20 for effective heat conductance therebetween during operation.

Figure 4:
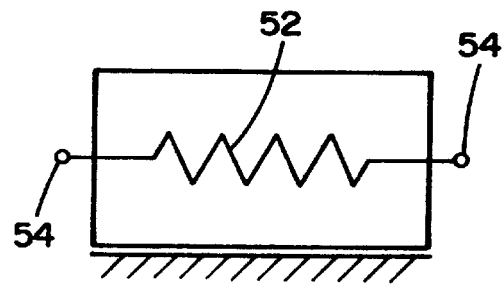
FIG. 4 illustrates the equivalent electrical circuit thereof.

FIG. 3 is an enlarged view of a high power solderless RF power film resistor 50 constructed pursuant to the present invention, and FIG. 4 illustrates the equivalent electrical circuit thereof by a resistor 52 connected between two output leads 54.

Figure 6:
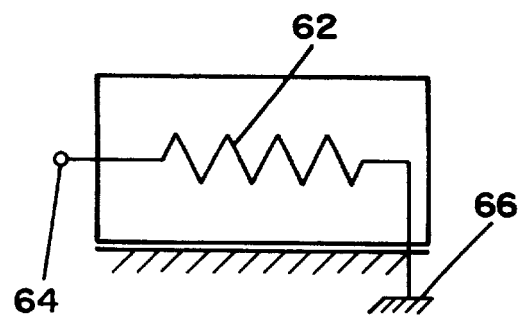
FIG. 6 illustrates the equivalent electrical circuit thereof.

FIG. 5 is an enlarged view of a high power RF power film termination 60 constructed pursuant to the present invention, and FIG. 6 illustrates the equivalent electrical circuit thereof by a resistor 62 connected between an output lead 64 and ground 66.

The illustrated embodiments show one preferred approach to clamping the BeO ceramic substrate 24 against the bottom plate 20. Alternative embodiments of the present invention could include alternative clamping approaches, such as by riveting or clipping.

A suggested mounting procedure for mounting the part 10 to a heat sink 14 is as follows.

1. Make sure that the device is mounted on a flat surface to optimize the heat transfer (0.001 in/in under the device).

2. Drill and tap the heat sink for the appropriate thread size to be used.

3. Coat the heat sink with a minimum amount of high quality silicone grease (0.001 inch maximum thickness).

4. Position the device on the mounting surface and secure using socket head screws, flat and split washers. Torque the screws to the appropriate value. Make sure that the device is flat against the heat sink.

While several embodiments and variations of the present invention for solderless RF power film resistors and terminations are described in detail herein, it should be apparent that the disclosure and teachings of the present invention will suggest many alternative designs to those skilled in the art.

What is claimed:

1. A solderless RF power film electrical resistor comprising:
   a. a base plate functioning as a heat sink and having a flat mounting surface, which base plate is to be secured to a further mounting heat sink;
   b. a substrate providing an RF power resistive film and also having a flat mounting surface positioned against the flat mounting surface of the base plate;
   c. clamping means including a clamping plate for clamping the flat surface of the substrate securely against the flat surface of the base plate, wherein the clamping plate includes two hollow lugs positioned on opposite sides of the substrate, and the base plate includes two lug holes positioned on opposite sides of the substrate, and each lug being inserted through a hole in the base plate and plastically deformed therein to clamp the flat surface of the substrate securely against the flat surface of the base plate, thereby eliminating a soldered interface connection between the flat mounting surface of the substrate and the base plate; and
   d. said further mounting heat sink, and wherein a torqued mounting screw extends through each hollow lug and each hole in the base plate and is threadedly secured in a threaded hole in the mounting heat sink, further clamping the flat surface of the substrate securely against the flat surface of the base plate, and also clamping the base plate, substrate and clamping means securely against the mounting heat sink.

2. A solderless RF power film resistor as claimed in claim 1, wherein the substrate comprises an RF power film termination.

3. A solderless RF power film resistor as claimed in claim 1, wherein each hole in the base plate includes an undercut shoulder into and around which the lug is plastically deformed.

4. A solderless RF power film resistor as claimed in claim 1, wherein a metal foil element is positioned between the substrate and the base plate which deforms into and fills any microscopic voids between the substrate and the base plate to increase the heat conductivity therebetween.

5. A solderless RF power film resistor as claimed in claim 1, wherein an epoxy preform element is positioned between the clamping plate and the substrate to adhere the clamping plate to the ceramic substrate.

6. A solderless RF power film resistor as claimed in claim 1, wherein the clamping plate is constructed of hard plastic to increase the frequency response of the electrical resistor by minimizing the capacitance between the clamping plate and the ceramic substrate.

7. A solderless RF power film resistor as claimed in claim 1, wherein said further mounting heat sink is positioned below a circuit board which includes an aperture in which the RF power film electrical resistor is mounted.

8. A solderless RF power film resistor as claimed in claim 1, wherein the substrate comprises a BeO ceramic substrate.

9. A solderless RF power film resistor as claimed in claim 1, wherein the substrate comprises a diamond substrate.

10. A solderless RF power film resistor as claimed in claim 1, wherein the substrate comprises an aluminum nitride substrate.

* * * * *